US005739419A

United States Patent [19]
Maier et al.

[11] Patent Number: 5,739,419
[45] Date of Patent: Apr. 14, 1998

[54] APPARATUS FOR MONITORING THE VACUUM OF A VACUUM SWITCH

[75] Inventors: Reinhard Maier, Herzogenaurach; Wolf-Eckhart Bulst, Munich; Thomas Ostertag, Ulm; Oliver Sczesny, Aschheim, all of Germany

[73] Assignee: Siemens Aktiengesellschaft, Munich, Germany

[21] Appl. No.: 694,939

[22] Filed: Aug. 9, 1996

[30] Foreign Application Priority Data

Aug. 10, 1995 [DE] Germany ........................ 195 29 499.8

[51] Int. Cl.[6] .......................... G01L 21/00; H01H 33/66; G01R 31/02; G01B 7/18

[52] U.S. Cl. ........................ 73/37; 73/40; 73/52; 73/592; 73/775; 324/460; 324/409; 340/626; 340/644; 340/605

[58] Field of Search .................................. 73/37, 40, 52, 73/592, 600, 775, 849; 324/460, 409, 424

[56] References Cited

U.S. PATENT DOCUMENTS

| | | | |
|---|---|---|---|
| 1,014,287 | 1/1912 | Erstine | 73/40 |
| 3,012,432 | 12/1961 | Moore et al. | 73/40 |
| 3,403,297 | 9/1968 | Crouch | 317/62 |
| 3,667,281 | 6/1972 | Pfeifer | 73/37 |
| 3,720,094 | 3/1973 | Knocke | 73/37 |
| 4,033,174 | 7/1977 | Samulowitz | 73/40 |
| 4,163,130 | 7/1979 | Kubota et al. | 200/144 B |
| 4,440,995 | 4/1984 | Lange et all. | 200/144 B |
| 4,462,257 | 7/1984 | Gerhart et al. | 73/644 |
| 4,547,769 | 10/1985 | Tanigaki et al. | 340/626 |
| 4,672,323 | 6/1987 | Kuhl et al. | 324/460 |
| 4,906,935 | 3/1990 | Hess et al. | 324/409 |
| 5,189,903 | 3/1993 | Hoffmann et al. | 73/40 |
| 5,307,669 | 5/1994 | Nishio | 73/46 |
| 5,392,637 | 2/1995 | Erdelsky | 73/40 |
| 5,399,973 | 3/1995 | Kitamura et al. | 324/424 |

FOREIGN PATENT DOCUMENTS

| | | |
|---|---|---|
| 0 056 722 | 7/1982 | European Pat. Off. . |
| 0079181 | 5/1983 | European Pat. Off. . |
| 0 150 389 | 8/1985 | European Pat. Off. . |
| 0 309 852 | 4/1989 | European Pat. Off. . |
| 0 365 005 | 4/1990 | European Pat. Off. . |
| 2002686 | 2/1971 | Germany . |
| 2 316 662 | 10/1973 | Germany . |
| 31 26 615 | 1/1983 | Germany . |
| 37 02 009 | 8/1988 | Germany . |
| 44 14 160 | 12/1995 | Germany . |

OTHER PUBLICATIONS

Söckl et al., "Electrische Messtechnik".

*Primary Examiner*—Hezron E. Williams
*Assistant Examiner*—J. David Wiggins
*Attorney, Agent, or Firm*—Hill & Simpson

[57] ABSTRACT

An apparatus for monitoring the vacuum of a vacuum switch having at least one vacuum switch tube with a switch chamber and switch contacts is provided. The apparatus has a remotely interrogatable pressure measurement sensor in the form of a piezocrystal or surface acoustic (SAW) device arranged in the interior of the vacuum switch tube and a remote interrogation device placed external to the vacuum switch for monitoring the vacuum via the sensor.

6 Claims, 2 Drawing Sheets

APPARATUS FOR MONITORING THE VACUUM OF A VACUUM SWITCH

BACKGROUND OF THE INVENTION

1. Field of the Invention

The present invention relates generally to vacuum switches and more particularly to an apparatus for monitoring the vacuum of a vacuum switch.

2. Description of the Related Art

Vacuum switches can perform their function, the interruption of currents, especially short-circuit currents, only if a certain minimum vacuum is present in the vacuum switch tube. If this is no longer the case due to a leak, in the extreme case this can lead during interruption to the destruction of the tube, with possible further harmful consequences. Previously it has been assumed that no vacuum loss arises in the switch tube, even after a long period of time. Due to the harmful consequences connected with such a vacuum loss, it is nonetheless desirable to be able to check the inner pressure of a vacuum switch built into the switching apparatus, without having to disassemble the switch tube from its mount for this purpose. From European patents 0 056 722 and 0 150 389, apparatus are known for the monitoring of the vacuum of vacuum switch tubes in the installed state. These references exploit what is called the Penning effect. Electrical and magnetic fields standing perpendicular to one another are produced, leading to a cold cathode discharge, whereby an ion current is produced whose value is proportional to the inner pressure of the switch tube. A disadvantage of these apparatus is that a measurement is not possible during operation, i.e. if the contact is open or closed. For measurement, in a testing mode the contact must be closed and the voltage must be applied between the contacts and the metallic coat. For measurement purposes, the switch must thus be completely isolated from the connections required during operation. For carrying out the measurement in standard vacuum switch tubes, it is also necessary to remove the tube from the switching apparatus so that the magnet required for the measurement can be attached.

Furthermore, from European letters patent 0 309 852 a method for the verification of a vacuum in vacuum tubes is known in which, given a contact travel lower than the rated travel of the vacuum switch, the X-ray radiation resulting from the application of high voltage is acquired and evaluated as a confirmation of the presence of an operating vacuum. However, this method also has a series of disadvantages. Thus, a drive mechanism must be used that enables a mechanical intermediate position with a small rated travel. Measurement is not possible when the contact is closed or fully open. It can thus be measured only in a testing mode. Finally, it is necessary to separate the switch from the network, since the application of the field emission is not predictable, and thus the dielectric strength is not guaranteed during the testing so that arcing is possible. Also, in the testing mode the switch is not usable.

SUMMARY OF THE INVENTION

It is an object of the present invention to provide an apparatus to monitor the vacuum of a vacuum switch that avoids the disadvantages named above, i.e. so that a measurement is possible both in the open and in the closed state during operation.

The object is solved by an apparatus for monitoring the vacuum of a vacuum switch having art least one vacuum switch tube with a switch chamber and switch contacts, wherein the apparatus has a remotely interrogatable pressure measurement sensor arranged in the interior of the vacuum switch tube; and a remote interrogation means for monitoring the vacuum via the sensor.

Through the use of a pressure monitoring in the vacuum switch tube of the present invention, the disconnection of a higher-level switch can be performed. Harmful consequences can thus be avoided.

It is particularly advantageous that the inventive apparatus includes a surface acoustic wave filter that can be remotely interrogated. The filter represents a purely passive component and requires no current supply.

The following specification provides a further explanation of the invention on the basis of the figures.

DETAILED DESCRIPTION OF THE EMBODIMENTS

Figure 1:
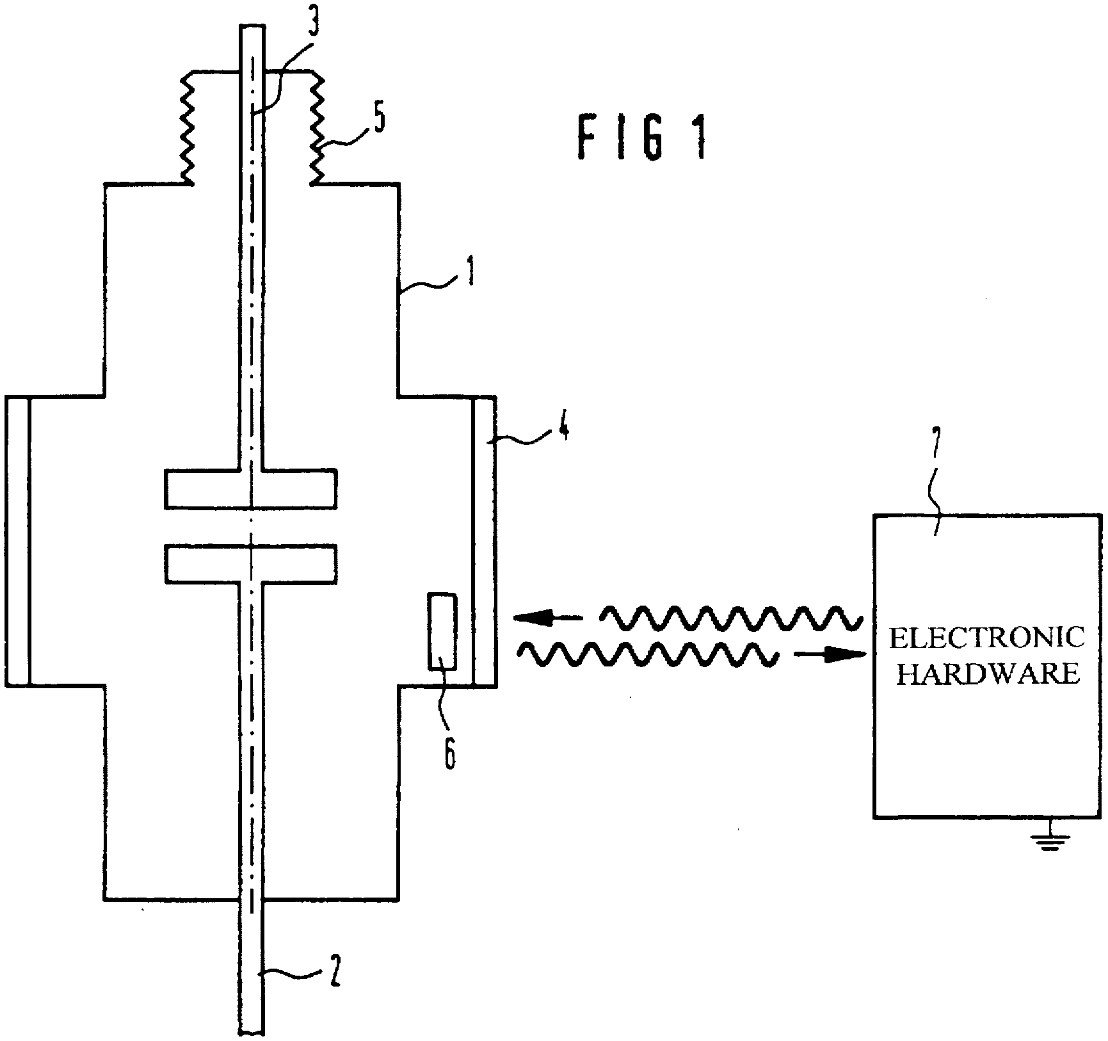
FIG. 1 is a schematic view of an embodiment of a vacuum switch tube provided with a monitoring apparatus of the present invention.

The vacuum switch tube 1 shown in FIG. 1 includes in its switching chamber a fixedly arranged first switch contact 2 and a second switch contact 3, arranged movably opposite the first switch contact 2. The actual switching chamber is essentially formed from a ceramic tube 4 in which the two switch contacts 2 and 3 are concentrically arranged. At the upper end, the vacuum switch tube 1 is closed by a flexible metal bellows 5. A remotely interrogatable pressure measurement box 6 is arranged on the insulating ceramic tube 4. The measurement 6 box can be interrogated by a remote interrogation apparatus 7.

Figure 2:
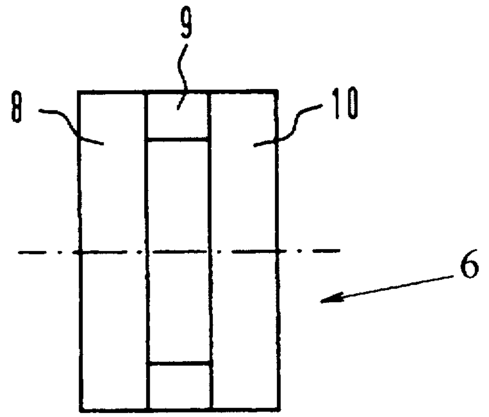
FIG. 2 is a schematic view of an embodiment of a pressure measurement box of the present invention.

A pressure measurement box shown is in FIG. 2 and includes a base 8, a ring 9 and, as a cover the substrate of, a surface wave filter 10. This pressure measurement box can be square in shape, but is preferably circular. Suitable dimensions for the box are 2 mm in height and 10 mm diameter of the pressure measurement box. The interior of the pressure measurement box can be evacuated or filled with a gas. In each case, the pressure measurement box is hermetically sealed. If the interior of the pressure measurement box is evacuated, the covers 8 and 10 of the pressure measurement box do not experience any bending as long as the pressure measurement box is located in the intact vacuum of the vacuum switch tube 1. If the vacuum is disturbed, the pressure in the vacuum switch tube 1 thus increases, and the covers 8 and 10 of the pressure measurement box are bent inward.

Figure 3:
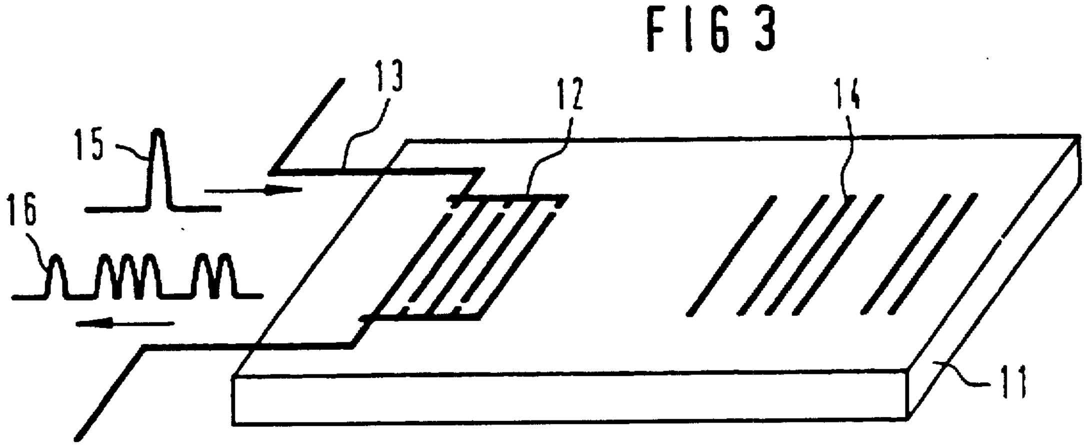
FIG. 3 is a schematic view of an embodiment of a remotely interrogatable surface wave filter of the present invention.

The effect of this bending on the surface wave filter, and the possibility of remote interrogation arising therefrom, is explained on the basis of FIG. 3, which shows a surface wave filter of this type. Such a surface wave filter includes as an essential component a substrate body 11. In most cases, the substrate body 11 is made of a piezoelectric, preferably monocrystalline, material. Suitable materials for the substrate body 11 include quartz, lithium niobate, lithium tantalate, and the like. An interdigital converter 12, an antenna 13 connected therewith, and reflectors 14 are provided on the surface of the substrate body 11. If a high-frequency interrogation impulse 15 is now sent out from the remote interrogation apparatus 7. The antenna 13 receives this interrogation impulse and supplies it to the interdigital converter 12, which generates from the impulse an acoustic wave in the substrate body 11. The acoustic wave is again reflected into the interdigital converter 12 by the reflector 14, and from there is radiated via the antenna 13 as a response signal 16. The reflector 14 can be so coded, in a known way, that a correspondingly coded response signal is achieved. This response signal 16 is in turn received by the remote interrogation apparatus 7.

The ability of the surface wave apparatus shown in FIG. 3 to check the vacuum in a vacuum switch tube results from the property of the substrate body 11 to be sensitive to pressure and tension. In particular, the spacing of the response pulses, or their phase position, is dependent on the pressure-tension state of the crystal. A surface acoustic wave apparatus, as shown in FIG. 3, requires no current supply, since it is fully passive.

A surface wave apparatus according to FIG. 3 can also be used as a measurement sensor without being arranged in a pressure measurement box according to FIG. 2, since the propagation of the acoustic waves is also dependent on the surrounding atmosphere. The wave propagation on the surface wave apparatus is modified upon penetration of air into the vacuum switch tube.

On the other hand, the surface wave apparatus, somewhat like the pressure measurement sensor 6 in FIG. 1, is arranged in such a way that no shielding of the electromagnetic waves from and to the remote interrogation device 7 occurs. This is ensured since the ceramic tube 4 is transparent to electromagnetic waves.

If the invention is used in a three-phase switching field, all three vacuum switches can be interrogated in parallel and at the same time with one remote interrogation device 7. Through the respective shielding of two tubes during maintenance after the determination of a tube defect, the defective vacuum switch tube can then be determined.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

We claim:

1. An apparatus for monitoring the vacuum of a vacuum switch having at least one vacuum switch tube with a switch chamber and switch contacts, the apparatus comprising:

a remotely interrogatable pressure measurement sensor arranged in the interior of the vacuum switch tube, wherein the remotely interrogatable pressure measurement sensor further has a remotely interrogatable surface acoustic wave filter or a surface acoustic wave resonator; and a remote interrogation means for monitoring the vacuum via the sensor, wherein the remote interrogation means includes apparatus that further has a transmitter, a receiver and an evaluation means.

2. The apparatus according to claim 1, wherein the pressure measurement sensor further comprises a pressure measurement box having at least one wall made of a piezocrystalline monocrystal that forms a substrate, the surface wave filter or the surface wave resonator formed on the substrate being attached to the box.

3. The apparatus according to claim 1, wherein the pressure measurement sensor is arranged on an insulating part of the vacuum switch tube.

4. The apparatus of claim 1, wherein the pressure measurement sensor is arranged on a ceramic tube of the vacuum switch tube.

5. The apparatus according to claim 1, wherein a common remote interrogation means is provided for a plurality of vacuum tubes of a vacuum switch.

6. The apparatus of claim 5, wherein the plurality of vacuum tubes is three as utilized for a three-phase switching field.

* * * * *